(12) United States Patent
Li et al.

(10) Patent No.: US 7,916,527 B2
(45) Date of Patent: Mar. 29, 2011

(54) READ REFERENCE CIRCUIT FOR A SENSE AMPLIFIER WITHIN A CHALCOGENIDE MEMORY DEVICE

(75) Inventors: Bin Li, Chantilly, VA (US); Adam Matthew Bumgarner, Duluth, GA (US); Daniel Pirkl, Centreville, VA (US)

(73) Assignees: BAE Systems Information and Electronic Systems Integration Inc., Nashua, NH (US); Ovonyx, Inc., Rochester Hills, MI (US)

(*) Notice: Subject to any disclaimer, the term of this patent is extended or adjusted under 35 U.S.C. 154(b) by 113 days.

(21) Appl. No.: 12/525,482

(22) PCT Filed: Nov. 26, 2008

(86) PCT No.: PCT/US2008/084781
§ 371 (c)(1),
(2), (4) Date: Jul. 31, 2009

(87) PCT Pub. No.: WO2009/070633
PCT Pub. Date: Jun. 4, 2009

(65) Prior Publication Data
US 2010/0002500 A1 Jan. 7, 2010

Related U.S. Application Data

(60) Provisional application No. 60/991,412, filed on Nov. 30, 2007.

(51) Int. Cl.
*G11C 11/00* (2006.01)
(52) U.S. Cl. ............... 365/163; 365/203; 365/189.09
(58) Field of Classification Search .............. 365/163, 365/113, 185.25, 189.09, 189.16, 203
See application file for complete search history.

(56) References Cited

U.S. PATENT DOCUMENTS

| | | | |
|---|---|---|---|
| 6,731,528 B2 | 5/2004 | Hush et al. | |
| 6,944,041 B1 | 9/2005 | Li et al. | |
| 6,954,385 B2 * | 10/2005 | Casper et al. | 365/189.07 |
| 7,024,502 B2 | 4/2006 | Horowitz et al. | |
| 7,245,526 B2 * | 7/2007 | Oh et al. | 365/163 |
| 7,420,851 B2 * | 9/2008 | Fasoli | 365/185.25 |

* cited by examiner

*Primary Examiner* — Gene N. Auduong
(74) *Attorney, Agent, or Firm* — Dillon & Yudell LLP; Antony P. Ng; Daniel J. Long

(57) ABSTRACT

A read reference circuit for a sense amplifier within a chalcogenide memory device is disclosed. The read reference circuit provides a reference voltage level to the sense amplifier for distinguishing between a logical "0" state and a logical "1" state within a chalcogenide memory cell. In conjunction with a precharge circuit, the read reference circuit generates a selectable read reference current to the sense amplifier in order to detect the logical state of the chalcogenide memory cell. The precharge circuit precharges the bitlines of the chalcogenide memory cell before the sense amplifier detects the logical state of the chalcogenide memory cell.

7 Claims, 2 Drawing Sheets

READ REFERENCE CIRCUIT FOR A SENSE AMPLIFIER WITHIN A CHALCOGENIDE MEMORY DEVICE

PRIORITY CLAIM

The present application claims benefit of priority under 35 U.S.C. §365 to the previously filed international patent application number PCT/US2008/084781 filed on Nov. 26, 2008, assigned to the assignee of the present application, and having a priority date of Nov. 30, 2007, based upon U.S. provisional patent application No. 60/991,412. The contents of both applications are incorporated herein by reference.

STATEMENT OF GOVERNMENT INTEREST

The present invention was made with United States Government assistance under Contract No. FA9453-04-C-0052 awarded by the United States Air Force. The United States Government has certain rights in the present invention.

BACKGROUND OF THE INVENTION

1. Technical Field

The present invention relates to memory devices in general, and in particular to a read reference circuit for a sense amplifier within a chalcogenide memory device.

2. Description of Related Art

Phase transformation is a process of changing a phase change material from an amorphous state into a crystalline state or vice versa. Such phase transformation generally occurs when an electrical field is being applied to a phase change material. Because the amorphous state of the phase change material has a different electrical resistance from the crystalline state of the phase change material, the two different states can be utilized to represent a logical "0" and a logical "1," respectively, for data storage applications.

An alloy known as chalcogenide, which includes germanium, antimony and tellurium, can be made to have phase transformation properties at a relatively low voltage. The electrical properties of chalcogenide are also particularly suitable for data storage applications. Since random access memories made of chalcogenide can easily be integrated with conventional logic circuits, chalcogenide random access memories have gradually become one of the more promising technologies for producing a new generation of memory devices, especially for light portable electronic devices.

Because of process variations of chalcogenide materials, the electrical characteristics of chalcogenide memory cells within a chalcogenide memory device tend to be less uniform than those of their complementary-metal oxide semiconductor (CMOS) counterparts. For example, the distribution of set and reset resistance values for chalcogenide memory cells may vary from one memory device to another. As a result, a static reference voltage that is commonly utilized by a sense amplifier circuit to determine a logical state of a memory cell within a CMOS random access memory device may not work properly for all chalcogenide memory cells within a chalcogenide memory device.

SUMMARY OF THE INVENTION

In accordance with a preferred embodiment of the present invention, a read reference circuit is utilized to provide a reference voltage level to a sense amplifier for distinguishing between a logical "0" state and a logical "1" state within a chalcogenide memory cell. In conjunction with a precharge circuit, the read reference circuit generates a selectable read reference current to the sense amplifier in order to detect the logical state of the chalcogenide memory cell. The precharge circuit precharges the bitlines of the chalcogenide memory cell before the sense amplifier detects the logical state of the chalcogenide memory cell.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
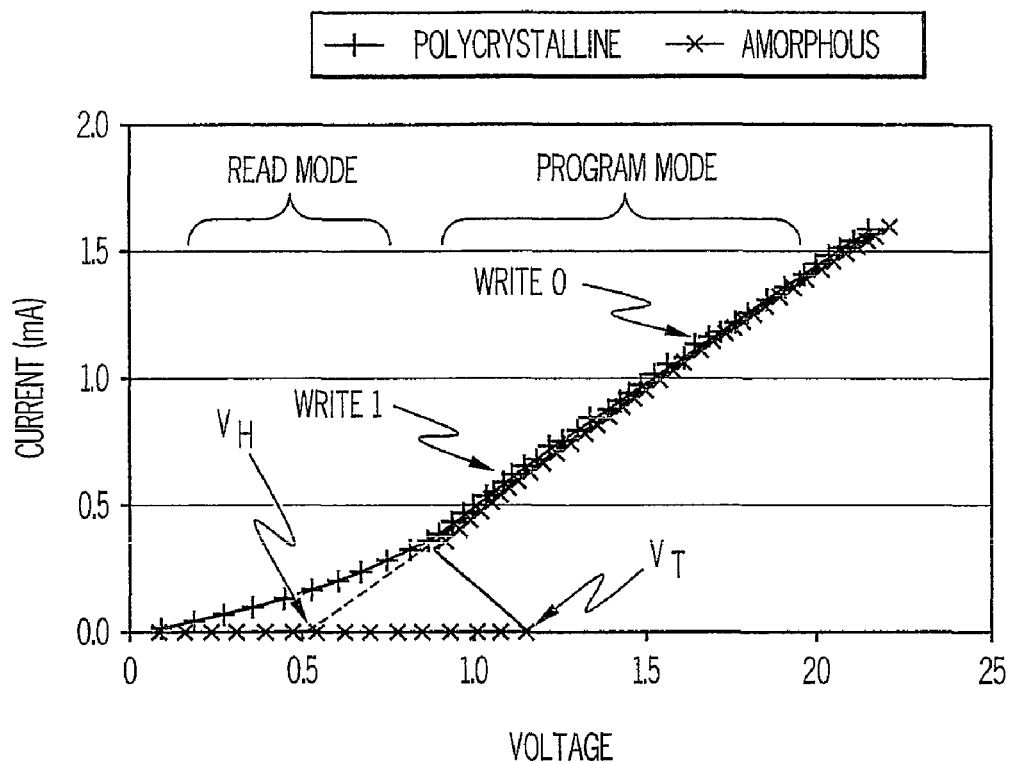
FIG. 1A is a current-voltage curve of a chalcogenide memory cell.

Referring now to the drawings and in particular to FIG. 1A, there is illustrated a current-voltage curve of a chalcogenide memory cell as the chalcogenide memory cell is being programmed and read. As shown, the chalcogenide material in the chalcogenide memory cell behaves like a quasi-linear resistor in a polycrystalline state, and the chalcogenide material exhibits a voltage snap-back at approximately a threshold voltage $V_T$ in an amorphous state.

The chalcogenide memory cell can be placed in a read mode when the applied voltage to the chalcogenide material within the chalcogenide memory cell is lower than the threshold voltage $V_T$. Conversely, the chalcogenide memory cell can be placed in a program (or write) mode when the applied voltage to chalcogenide material within the chalcogenide memory cell is higher than the threshold voltage $V_T$.

Figure 1B:
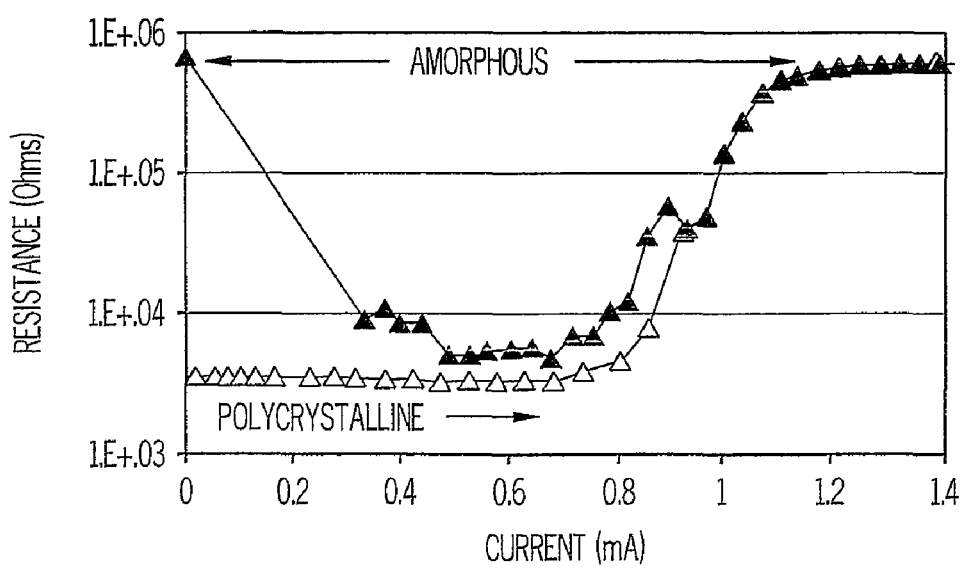
FIG. 1B is a resistance-current curve of a chalcogenide memory cell.

During the program mode, the chalcogenide memory cell can be programmed to either a low-resistance state (i.e., a logical "1" or set) or a high-resistance state (i.e., a logical "0" or reset) by utilizing different write current amplitude to heat the chalcogenide material within the chalcogenide memory cell to either the polycrystalline state or the amorphous state, respectively, as shown in FIG. 1B.

Writing a logical "1" requires a lower current amplitude and a relatively long cooling time. In contrast, writing a logical "0" requires a higher current amplitude and a much shorter cooling time.

An extrapolation of the linear region of the current-voltage curve in FIG. 1A to the x-axis yields a point known as a holding voltage $V_H$. In order to exit the program mode, the applied voltage to the chalcogenide memory cell must be less than the holding voltage $V_H$.

Figure 2:
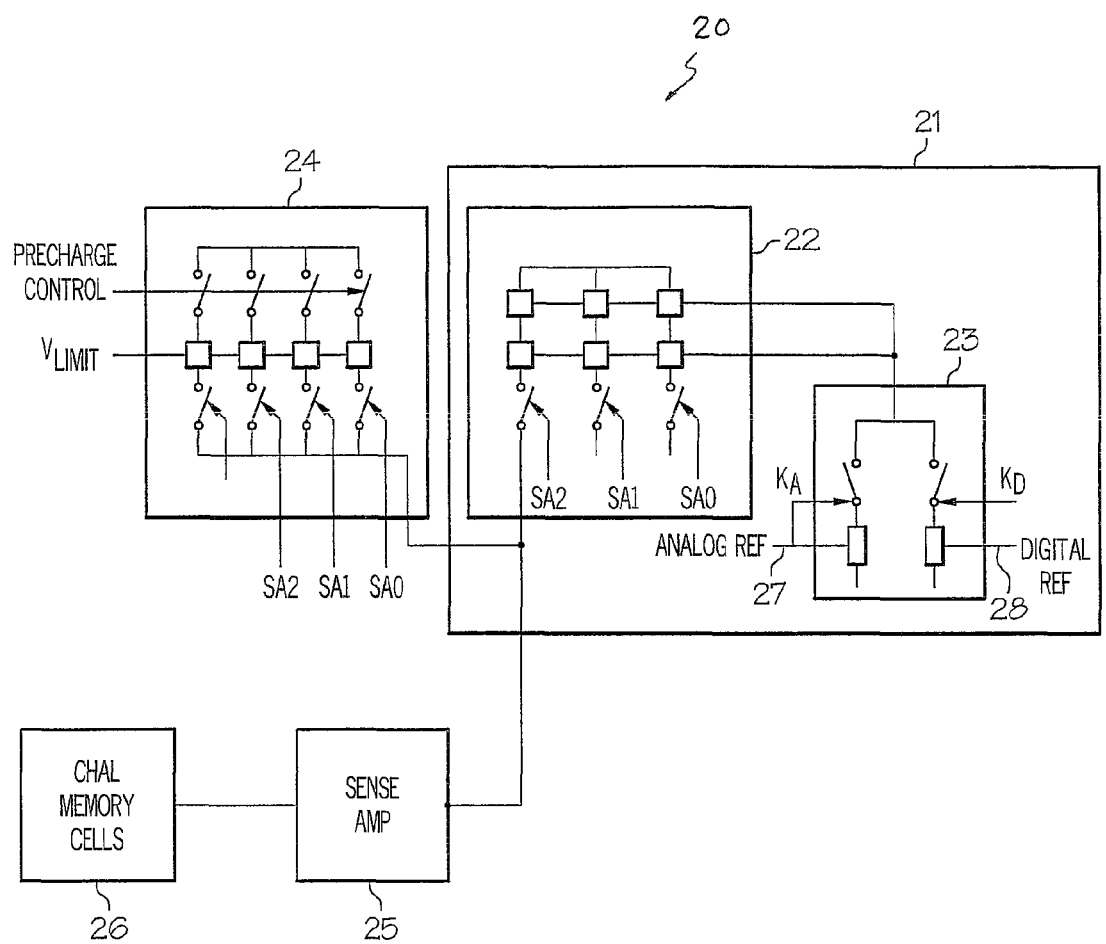
FIG. 2 is a block diagram of a read reference circuit, in accordance with a preferred embodiment of the present invention.

With reference now to FIG. 2, there is illustrated a block diagram of a read reference circuit, in accordance with a preferred embodiment of the present invention. As shown, a read reference circuit 20 is coupled to a sense amplifier circuit 25 and a set of chalcogenide memory cells 26. Each of chalcogenide memory cells 26 can be placed in an amorphous state or a crystalline state, which is utilized to represent a logical "0" and a logical "1," respectively. The state of each of chalcogenide memory cells 26 can be changed from one to another via the application of an electrical field accordingly.

Sense amplifier circuit 25 serves to detect the logical states of chalcogenide memory cells 26 based on a reference voltage as is well-known in the art. However, because of process variations of chalcogenide materials, the electrical characteristics of chalcogenide memory cells 26 tend to be less uniform than those of their complementary-metal oxide semiconductor (CMOS) counterparts. For example, the distribution of set and reset (i.e., "1" and "0") resistance values for chalcogenide memory cells 26 may vary from one chip to another. As a result, a static reference voltage that is commonly utilized by a sense amplifier circuit to determine a logical state (i.e., "1" or "0") of a memory cell within a CMOS random access memory device may not work properly for all chalcogenide memory cells 26.

As such, read reference circuit 20 is configured to provide a dynamic sense amplifier reference current (or voltage) to sense amplifier circuit 25 for the purpose of discerning logical states of chalcogenide memory cells 26. After determining the precharge voltage level, read reference circuit 20 generates an analog sense reference override signal to sense amplifier circuit 25.

As shown in FIG. 2, read reference circuit 20 includes a current level generation circuit 21 and a precharge circuit 24. Current level generation circuit 21 further includes a current tuning circuit 22 and a reference level adjustment circuit 23.

Reference level adjustment circuit 23 includes a digital reference current input 28 and an analog reference override input 27. Analog reference override input 27 allows the reference current to sense amplifier 25 to be changed dynamically during the performance of a margin test. During a margin test, the sense amplifier reference current can be set at above or below a built-in reference current in order to determine a margin for programming chalcogenide memory cells 26. Any one of chalcogenide memory cells 26 that has a lower margin can be replaced by an available redundant memory cell. During normal operations, a switch $K_A$ associated with analog reference override input 27 is left open. Current can be supplied to digital reference current input 28 via a current mirror circuit (not shown).

An analog reference override input 27 is an external control signal to reference level adjustment circuit 23. During normal operations, analog reference override input 27 is grounded in order to disable the override function. During a margin test, analog reference override input 27 is "shmooed" in the range that is greater than a predetermined $V_{override}$ threshold. The $V_{override}$ threshold provides a noise margin in case there is noise on the override input. Basically, analog reference override input 27 allows the measurements of ones and zeros across chalcogenide memory cells 26 quickly since it uses sense amplifier 25 and digital output path and no analog measurements are necessary.

Precharge circuit 24 precharges the bitlines of chalcogenide memory cells 26 before sense amplifier 25 detects the logical state chalcogenide memory cells 26. Preferably, precharge circuit 24 precharges the bitlines to approximately 200-400 mV. Precharge circuit 24 is enabled by a precharge control signal. Precharge circuit 24 is also controlled by a reference set point $V_{limit}$ in order to ensure that the bitlines are changed enough that logical "0" can be read normally. For example, $V_{limit}$ needs to be much greater than the threshold voltage $V_T$ of a chalcogenide cell during a read operation.

Read reference circuit 20 may provide a range of sense amplifier reference currents for reading the resistances of different chalcogenide memory cells 26. Current tuning circuit 22 is implemented with capacitors and cascaded current mirror structures to provide a high noise rejection. Current tuning circuit 22 includes multiple switches for programming read reference circuit 20 to the desired current for a given distribution of set and reset resistance values within chalcogenide memory cells 26. For example, three switches SA0-SA2 are included within current tuning circuit 22, as well as precharge circuit 24, to provide eight different reference current levels. Any of SA0-SA2 can be open or close to provide different reference current levels for respective chalcogenide memory cells 26 based on characterization information.

As has been described, the present invention provides a read reference circuit for a sense amplifier within a chalcogenide memory device.

While the invention has been particularly shown and described with reference to a preferred embodiment, it will be understood by those skilled in the art that various changes in form and detail may be made therein without departing from the spirit and scope of the invention.

What is claimed is:

1. An apparatus comprising:
   a precharge circuit for precharging bitlines of a plurality of chalcogenide memory cells before a sense amplifier detects a logical state of said plurality of chalcogenide memory cells; and
   a read reference circuit for generating a selectable read reference current to said sense amplifier for the purpose of detecting logical states of said chalcogenide memory cells based on said selectable read reference current.

2. The apparatus of claim 1, wherein said read reference circuit includes a current tuning circuit and a reference level adjustment circuit.

3. The apparatus of claim 2, wherein said current tuning circuit includes a plurality of switches for providing different reference current levels.

4. The apparatus of claim 2, wherein said reference level adjustment circuit includes a digital reference current input and an analog reference override input.

5. The apparatus of claim 4, wherein said digital reference current input is supplied by a current mirror.

6. The apparatus of claim 4, wherein said sense amplifier reference current is set at above or below a built-in reference current in order to determine a margin for programming said chalcogenide memory cells, during a margin test.

7. The apparatus of claim 1, wherein said precharge circuit precharges said bitlines to approximately 200-400 mV.

* * * * *